(12) United States Patent
Lee (10) Patent No.: US 7,511,551 B2
(45) Date of Patent: Mar. 31, 2009

(54) VOLTAGE CONVERTER AND METHOD OF PERFORMING THE SAME

(75) Inventor: Jong Eon Lee, Suwon (KR)

(73) Assignee: Samsung Electronics, Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/844,504

(22) Filed: May 13, 2004

(65) Prior Publication Data
US 2005/0088217 A1    Apr. 28, 2005

(30) Foreign Application Priority Data
Oct. 24, 2003    (KR) .................. 10-2003-0074684

(51) Int. Cl.
*H03L 5/00*    (2006.01)
(52) U.S. Cl. .................. 327/333; 326/81
(58) Field of Classification Search ............. 327/333; 326/80, 81, 68; 365/189.11
See application file for complete search history.

(56) References Cited

U.S. PATENT DOCUMENTS

| | | | | |
|---|---|---|---|---|
| 5,105,099 A | * | 4/1992 | Routh et al. ............ | 327/384 |
| 5,469,080 A | * | 11/1995 | Son ....................... | 326/81 |
| 5,543,740 A | * | 8/1996 | Wong .................... | 327/108 |
| 5,760,610 A | | 6/1998 | Naffziger | |
| 6,037,720 A | * | 3/2000 | Wong et al. ............ | 315/291 |
| 6,064,227 A | | 5/2000 | Saito ..................... | 326/68 |
| 6,353,345 B1 | * | 3/2002 | Yushan et al. .......... | 327/112 |
| 6,366,127 B1 | | 4/2002 | Friedman et al. | |
| 6,426,652 B1 | | 7/2002 | Greenhill et al. | |
| 6,480,050 B1 | * | 11/2002 | Barnes ................... | 327/333 |
| 6,646,469 B2 | * | 11/2003 | Yushan ................... | 326/83 |
| 7,323,912 B2 | * | 1/2008 | Nielsen .................. | 327/108 |
| 2001/0013795 A1 | | 8/2001 | Nojiri .................... | 326/81 |
| 2003/0025527 A1 | | 2/2003 | Porter et al. | |

(Continued)

FOREIGN PATENT DOCUMENTS

JP      08-065136      3/1996

(Continued)

OTHER PUBLICATIONS

Korean Patent Office Communication dated Jun. 30, 2005, for Korean Application No. 10-2003-0074684 with English Translation.

(Continued)

*Primary Examiner*—Lincoln Donovan
*Assistant Examiner*—William Hernandez
(74) *Attorney, Agent, or Firm*—Harness, Dickey & Pierce, P.L.C.

(57) ABSTRACT

A voltage converter and a method of converting a voltage which maintain a first driver of a driver pair in an active state, where current flows, for only a predetermined time period. The driver pair may include a pull-up driver and a pull-down driver. One driver may be active when an input signal has a first transition, but not a second transition. The other driver may be active when the input signal has the second transition, but not the first transition. Alternatively, one driver may be inactive when the input signal has the second transition and active for a first portion of the first transition and inactive for a second portion of the first transition. Alternatively, only one driver may be active at any given time.

40 Claims, 10 Drawing Sheets

U.S. PATENT DOCUMENTS

2003/0081459 A1 5/2003 Hosono et al.
2004/0027178 A1* 2/2004 Chae et al. .................. 327/112

FOREIGN PATENT DOCUMENTS

JP 1020020022919 A 3/2002
KR 10-1994-0022617 4/1995

OTHER PUBLICATIONS

Office Action dated Nov. 26, 2008 for corresponding German Application No. 10 2004 052 524.

Kuo-Hsing Cheng et al., "The Charge-Transfer Feedback Controlled Split-Path CMOS Buffer", *Trans. Briefs*, vol. 46, No. 9, pp. 346-348 (Mar. 1999).

* cited by examiner

CONVENTIONAL ART

VOLTAGE CONVERTER AND METHOD OF PERFORMING THE SAME

CROSS-REFERENCE TO RELATED APPLICATIONS

This application claims the benefit under 35 U.S.C. § 119(a) of Korean Patent Application No. 2003-0074684, filed on Oct. 24, 2003, the contents of which are hereby incorporated by reference in their entirety.

BACKGROUND OF THE INVENTION

1. Field of the Invention

The present invention relates to a voltage converter and a method of converting a voltage, and more particularly, to a high-speed and low-power voltage level converter circuit and method for performing the same.

2. Description of the Relate Art

Power consumption may be an issue for portable electronic systems. In CMOS circuits, it is known that the power consumption is proportional to the square of a supply voltage. With a quadratic relationship to power, lowering voltage offers an effective way of reducing power consumption. However, a penalty of lowering voltage may be increased propagation delay.

Conventional techniques to reduce supply voltage without degrading the performance are available. To achieve high-speed operation and/or low-power consumption, a multiple supply voltage (MSV) is frequently used. In MSV, however, a current flowing directly from the applied voltage source to ground may consume undesirable power for low power applications. A DC current flowing from the supply voltage to the ground voltage may consume relatively high amounts of power, while also increasing the propagation time of the circuit. To remove undesirable power consumption, level converters may be placed between logic circuits.

Figure 1:
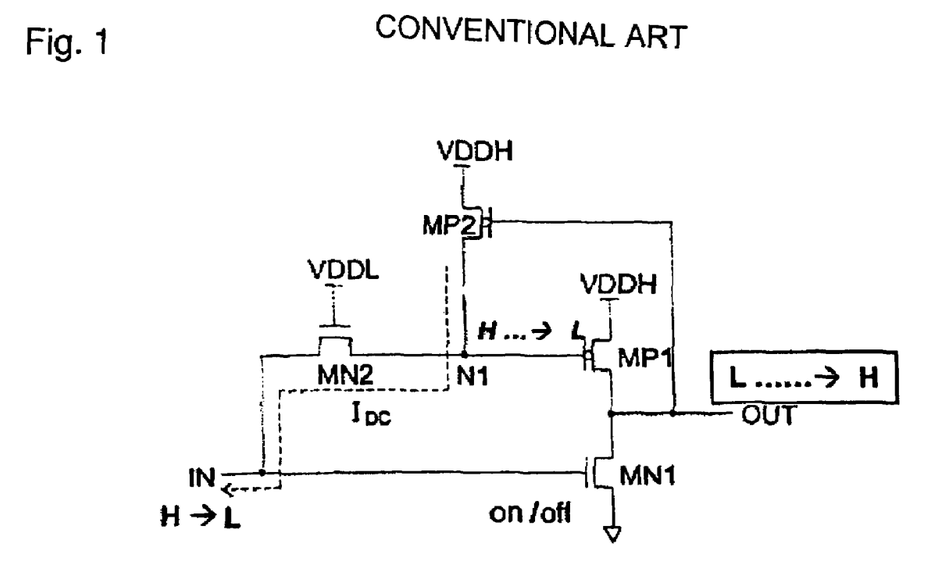
FIG. 1 illustrates a conventional buffer-type level converter (BTLC).

One example of a conventional method is depicted in FIG. 1. FIG. 1 illustrates a conventional buffer-type level converter (BTLC). Upon transition of an input signal IN from a high level to a low level, an NMOS transistor MN1 is turned off and a voltage node N1 is discharged through an NMOS transistor MN2, causing a PMOS transistor MP1 to turn on. While the node N1 voltage is discharged through the NMOS transistor MN2, a PMOS transistor MP2 is turned on by an output signal OUT supplying a current to the node N1. The PMOS transistor MP2 is turned on until the output signal OUT is sufficiently increased to a high level. Thus, there exists a DC path IDC from a supply voltage VDDH to the input node N1 through the NMOS transistor MN2.

This results in an increase in transition delay of the output signal OUT. This phenomenon may become more serious as a supply voltage VDDL is lowered because a gate-source voltage of the NMOS transistor MN2 is decreased. As the gate-source voltage of the transistor MN2 is decreased, the amount of current flowing via the NMOS transistor MN2 is decreased. This increases the transition delay of the output signal OUT, with the existence of a DC path.

Figure 2:
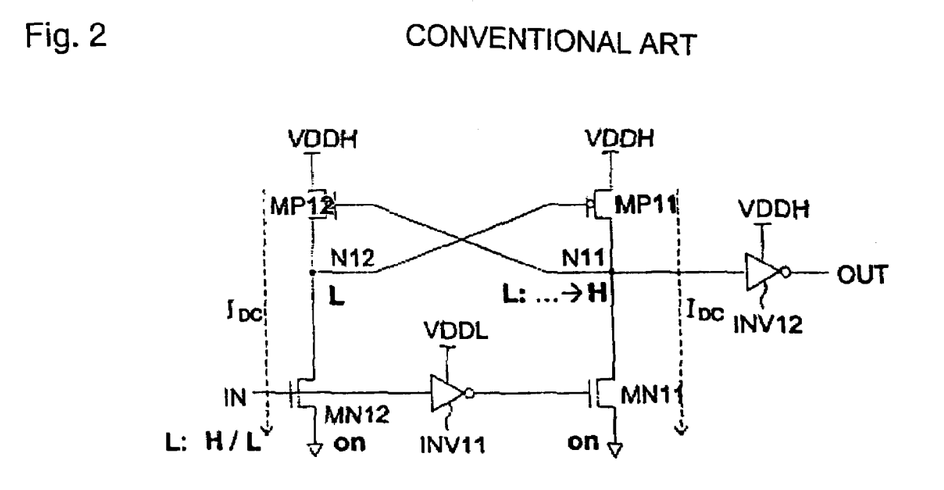
FIG. 2 illustrates a conventional dual cascade voltage switch (DCVS).

Another example of a conventional method is depicted in FIG. 2. FIG. 2 illustrates a conventional dual cascade voltage switch (DCVS). When an input signal IN is at a low level, node N11 is a low level and node N12 is at a high level. In this condition, when the input signal IN has a low-to-high transition, an NMOS transistor MN12 is turned on and discharges a voltage of the node N12 to a ground voltage. At this time, since a PMOS transistor MP12 is turned on, a DC path is formed between a supply voltage VDDH and a ground voltage. Likewise, when the input signal IN has a high-to-low transition, an NMOS transistor MN11 is turned on, discharging a voltage of the node N11 to a ground voltage. At this time also, since a PMOS transistor MP11 is turned on, a DC path is formed between a supply voltage VDDH and a ground voltage.

This also results in an increase in transition delay of the output signal OUT. This phenomenon may become more serious as a supply voltage VDDL is lowered because a gate-source voltage of the NMOS transistor MN11 is decreased. As the gate-source voltage of the transistor MN11 is decreased, the amount of current flowing via the NMOS transistor MN11 is decreased. This increases the transition delay of the output signal OUT, with the existence of a DC path.

Figure 3:
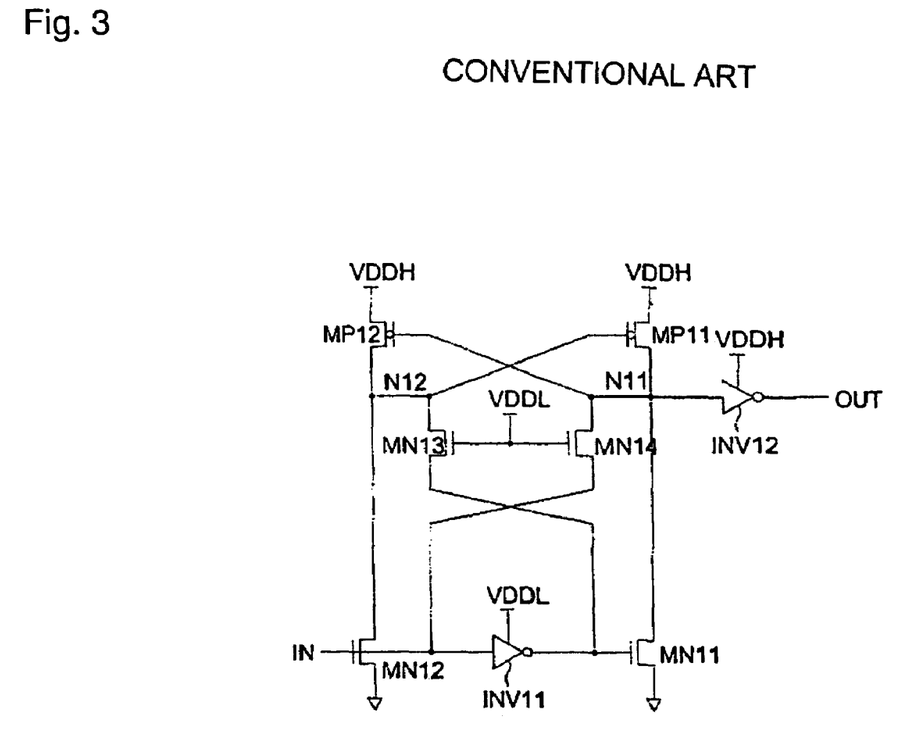
FIG. 3 illustrates a conventional symmetrical dual cascade voltage switch (SDCVS).

Another example of a conventional method is depicted in FIG. 3. FIG. 3 illustrates a conventional symmetrical dual cascade voltage switch (SDCVS).

The SDCVS in FIG. 3 may be used to reduce transition delay of the DCVS of FIG. 2. This may be accomplished by adding NMOS transistors MN13 and MN14 to turn off the PMOS transistor MP11 or MP12 more quickly at a transition of the input signal IN. However similar to the converter circuit in FIG. 2, the converter circuit in FIG. 3 suffers from DC path problems.

As set forth above conventional converter circuits, such as the BLTC, DCVS and SDCVS circuits described above, have a problem that a transition delay of an output signal becomes longer due to a DC path, or in other words, undesirable power consumption is increased.

SUMMARY OF THE INVENTION

Example embodiments of the present invention improve voltage conversion, reduce power consumption, decrease transition delay, reduce or eliminate the possibility of a floating voltage, and/or reduce or eliminate the possibility of a DC path.

Example embodiments of the present invention achieve this by maintaining a first driver of a driver pair in an active state, where current flows, for only a predetermined time period. Further, no current flows through the first driver to an output node when the first driver is in an inactive state.

The second driver may be activated by a second transition of the input signal to the output signal and the first driver may be maintained in the inactive state until the second transition is complete.

Example embodiments of the present invention may be used in a pull-up/pull-down arrangement.

The first driver may be a pull-up driver and the second driver may be a pull-down driver. In example embodiments of the present invention, the pull-down driver may be maintained inactive when the input signal has a first transition and the pull-up driver may be maintained active only until an output signal reaches a logic threshold voltage and the pull-up driver may be maintained inactive when the input signal has a second transition.

In example embodiment, the input signal has a voltage of less than 1V, for example, 0.65-0.9V.

In other example embodiments of the present invention, an output node is pulled up to a second supply voltage in response to an output of a control node when an input signal has a first transition, but not a second transition and the output node is pulled down to ground voltage in response to the input signal when the input signal has a second transition, but not the first transition.

In other example embodiments of the present invention, the pull-up driver pulls an output node up to the second supply voltage, the pull-down driver pulls the output node down to ground voltage in response to the input signal, and a controller pulls the output node up to the second supply voltage in response to an output of a control node when the input signal has a first transition, but not a second transition and pulls the output node down to ground voltage in response to the input signal when the input signal has the second transition, but not the first transition.

In other example embodiments of the present invention, the pull-up driver pulls an output node up to the second supply voltage, the pull-down driver for pulls the output node down to ground voltage in response to the input signal, and the controller for controls the pull-up driver in response to the input signal and the output signal, so that the pull-up driver is inactive when the input signal has a second transition and active for a first portion of a first transition and inactive for a second portion of the first transition.

In other example embodiments of the present invention, an output node is pulled up to the second supply voltage in response to an output of a control node during a first portion of a first transition of the input signal, but not a second portion of the first transition or a second transition and the output node is pulled down to ground voltage in response to the input signal when the input signal has the second transition, but not the first transition.

In other example embodiments of the present invention, a pull-up driver and a pull-down driver pull an output node up and down, respectively and the controller controls the pull-up driver and the pull-down driver so that only one is active at any given time.

In other example embodiments of the present invention, a pull-up driver and a pull-down driver are controlled so that only one is active at any given time.

As set forth above, example embodiments of the present invention improve voltage conversion, reduce power consumption, decrease transition delay, reduce or eliminate the possibility of a floating voltage, and/or reduce or eliminate the possibility of a DC path.

BRIEF DESCRIPTION OF THE DRAWINGS

The present invention will become more fully understood from the detailed description given below and the accompanying drawings, which are given for purposes of illustration only, and thus do not limit the invention.

DETAILED DESCRIPTION OF THE EXEMPLARY EMBODIMENTS

Figure 4:
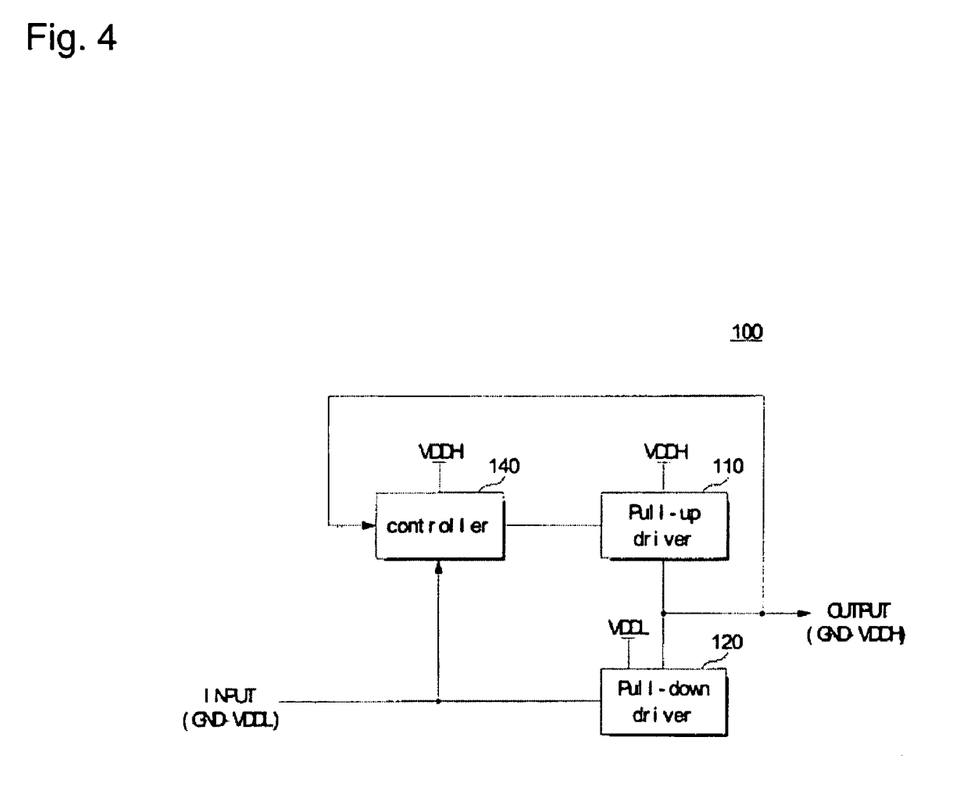
FIG. 4 illustrates a voltage level converter circuit according to an exemplary embodiment of the present invention.

FIG. 4 illustrates a voltage level converter circuit according to an exemplary embodiment of the present invention. The voltage level converter circuit 100 converts an input signal INPUT with a first supply voltage VDDL to an output signal OUTPUT with a second supply voltage VDDH. The voltage level converter circuit 100 may include a pull-up driver 110, a pull-down driver 120 and a controller 140. The pull-up driver 110 and the controller 140 may be supplied with the second supply voltage VDDH and the pull-down driver 120 may be supplied with the first supply voltage VDDL.

The pull-up driver 110 may pull an output node OUTPUT up to the second supply voltage VDDH in response to an output of the controller 140, and the pull-down driver 120 may pull the output node OUTPUT down to a ground voltage as a reference voltage in response to the input signal INPUT. The pull-down driver 120 does not conduct when the input signal INPUT has a first transition (e.g. a low-to-high transition or a high-to-low transition), while the pull-down driver 120 conducts when the input signal INPUT has a second transition (e.g. a high-to-low transition or a low-to-high transition). The controller 140 may control the pull-up driver 110 in response to the input signal INPUT and/or the output signal OUTPUT.

For example, when the input signal INPUT has a first transition (e.g. a low-to-high transition or a a high-to-low transition), the controller 140 responds to the input and output signals INPUT and OUTPUT to control the pull-up driver 110 so as to be activated during a given time. The given time is a time required until the output node OUTPUT is increased from a ground voltage to a threshold voltage, which will be more fully described below. On the other hand, when the input signal INPUT has a second transition (e.g. a high-to-low transition or a low-to-high transition), the controller 140 may respond to the input and output signals INPUT and OUTPUT and may control the pull-up driver 110 so that the pull-up driver 110 is maintained in an inactive or nonconductive state. At the same time, the pull-down driver 120 may be activated by the second transition of the input signal INPUT. That is, when the input signal INPUT has the second transition, a voltage of the output node OUTPUT is discharged via the pull-down driver 120, while the pull-up driver 110 not activated. Accordingly, since the pull-down driver 120 is activated at an inactive state of the pull-up driver 110, no DC path exists (or no short-circuit current exists) due to simultaneous activation of the pull-up and pull-down drivers 110 and 120.

According to this exemplary embodiment, since no DC path exists, the voltage level converter circuit 100 may consume less power consumption and/or perform higher speed operations.

Figure 5:
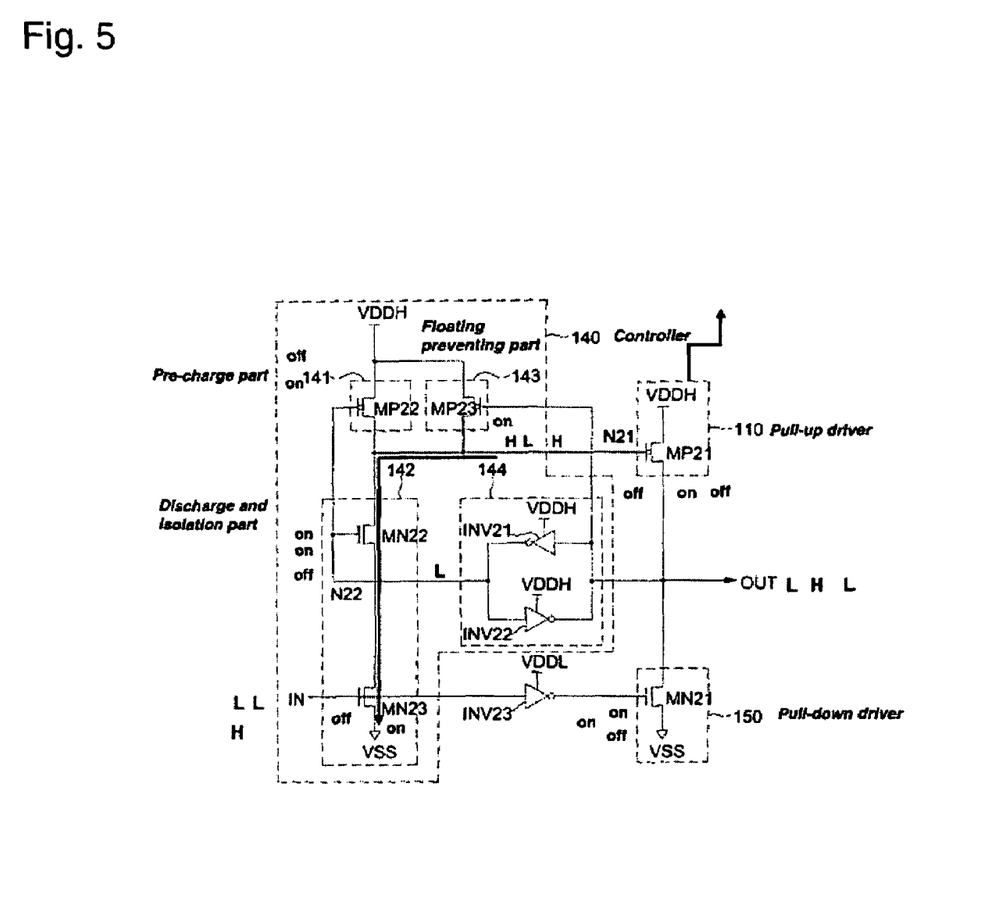
FIG. 5 is an example circuit implementation of the voltage level converter circuit of FIG. 4.
Figure 6:
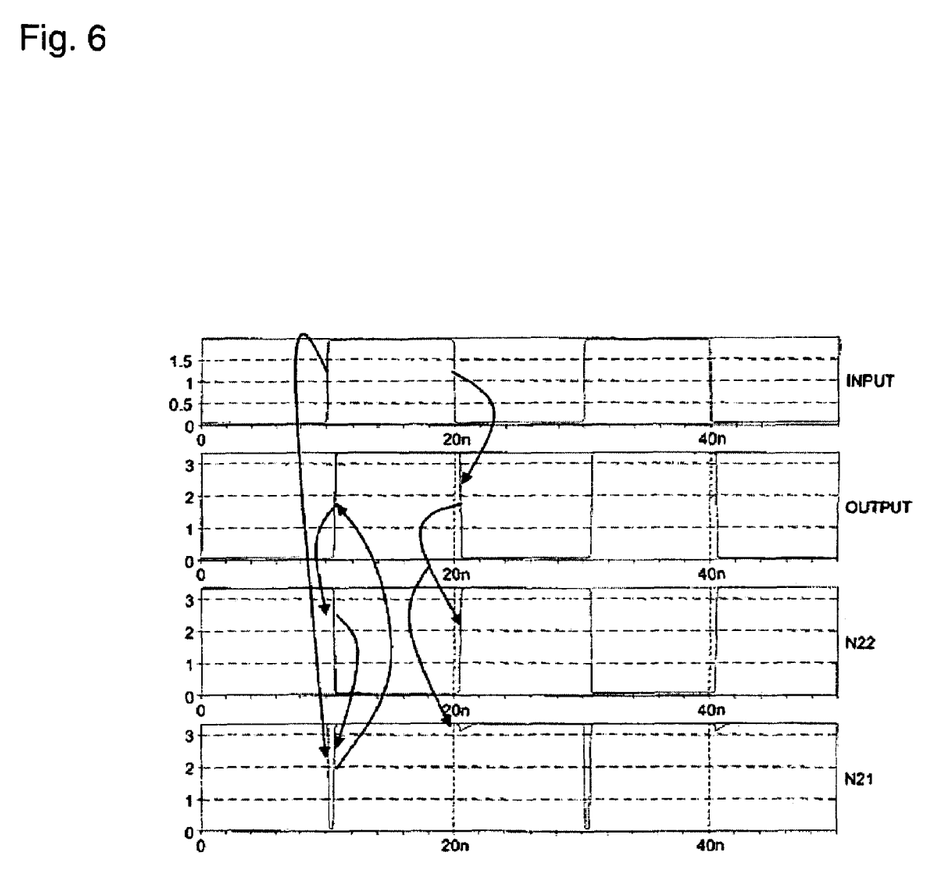
FIG. 6 is a diagram illustrating various node voltages of the voltage level converter circuit of FIG. 5.

FIG. 5 is an example circuit implementation of the voltage level converter circuit 100 of FIG. 4 and FIG. 6 is a diagram illustrating the voltages of the input signal INPUT, the output node OUTPUT, a control node N21, and a node N22 of the voltage level converter circuit of FIG. 5. Referring to FIG. 5, the pull-up driver 110 may include a PMOS transistor MP21, which has a source connected to a second supply voltage VDDH, a drain connected to an output node OUTPUT, and a gate connected to the control node N21. The pull-down driver 120 may include an NMOS transistor MN21, which is connected between the output node OUTPUT and a ground voltage VSS and may be controlled by an input signal INPUT transferred via an inverter INV23. The controller 140 may include a pre-charge part 141, a discharge and isolation part 142, a floating preventing part 143 and a latch 144.

The pre-charge part 141 may charge the control node N21 to the second supply voltage VDDH in response to an output of the latch 144 (or a voltage of the node N22). The pre-charge part 141 may include a PMOS transistor MP22, which is connected between the second supply voltage VDDH and the control node N21 and have a gate connected to receive an output of the latch 144. The discharge and isolation part 142 may include NMOS transistors MN22 and MN23. The NMOS transistor MN22, whose gate may be connected to receive a latched signal in the latch 144, may have a drain connected to the control node N21 and a source connected to a drain of the NMOS transistor MN23. The NMOS transistor MN23 may have a source grounded and a gate connected to receive an input signal INPUT. The floating preventing part 143 may prevent the control node N21 from floating in response to an output signal OUTPUT. That is, the floating preventing part 143 may prevent the control node N21 from floating when the PMOS transistor MP22 and the NMOS transistor MN23 are both turned off.

The floating preventing part 143 may include a PMOS transistor MP23 that is connected between the second supply voltage VDDH and the control node N21 and have a gate connected to receive the output signal OUTPUT.

The latch 144 may include two inverters. An input of the inverter INV21 may be connected to an output node OUTPUT, and an output thereof may be connected to the node N22. An input of the inverter INV22 may be connected to the node N22 and an output thereof may be connected to the output node OUTPUT.

In the example embodiment of FIG. 5, the PMOS transistor MP23 of the floating preventing part 143, has a weak driving capacity so as to supply a current sufficient to prevent the control node N21 from floating.

In operation, assuming that an output node OUTPUT is at a low level, PMOS and NMOS transistors MP23 and MN22 are turned on while PMOS transistor MP22 is turned off. As control node N21 is charged to a high level by the PMOS transistor MP23, the PMOS transistor MP21 of the pull-up driver is fully turned off. In this condition, when an input signal INPUT is at a low level, the NMOS transistor MN21 is turned on so that the output node OUTPUT continues to be maintained low. If the input signal INPUT transitions from a low level to a high level (or more generally, has a first transition), the NMOS transistor MN21 of the pull-down driver is turned off while the NMOS transistor MN23 is turned on. Since the NMOS transistor MN22 is turned on by an output of a latch 144, the control node N21 is discharged via the NMOS transistors MN22 and MN23. This enables the PMOS transistor MP21 to be turned on, so that the output signal OUTPUT starts to transition from a low level of a ground voltage VSS to a high level of a second supply voltage VDDH. When a voltage of the output node OUTPUT reaches a trip voltage of the inverter INV21, node N22 goes low. This turns on the PMOS transistor MP22 and turns off the NMOS transistor MN22, so that the PMOS transistor MP21 is turned off. As a result, the pull-up driver 110 is turned on only until the output node OUTPUT is charged up to a trip voltage of the inverter INV21.

As the output signal OUTPUT transitions from a low level to a high level, the PMOS transistor MP22 is turned on while the NMOS transistor MN22 is turned off. Accordingly, the control node N21 is isolated from the NMOS transistor MN23 or the ground voltage VSS and is simultaneously charged to the second supply voltage VDDH, via the PMOS transistor MP22. This turns off the PMOS transistor MP21. Further, since the NMOS transistor MN22 is turned off, no DC path exists between the control node N21 and the ground voltage VSS or between the second supply voltage VDDH and the ground voltage VSS. Although the PMOS transistor MP21 is turned off during a high-level period of the input signal INPUT, a high level of the output signal OUTPUT is maintained by the latch 144. The inverter INV21 of the latch 144 may detect whether an output node OUTPUT reaches a trip voltage as a detection voltage.

When the input signal INPUT transitions from a high level to a low level (or more generally, has a second transition), the NMOS transistor MN23 is turned off while the NMOS transistor MN21 is turned on. Thus a voltage of the output node OUTPUT is discharged via the NMOS transistor MN21. At this time, as described above, since the PMOS transistor MP21 is turned off, no DC path is formed between the second supply voltage VDDH and the ground voltage VSS via the PMOS and NMOS transistors MP21 and MN21. This is because the PMOS transistor MP21 is turned off. As a result, undesirable power consumption and/or transition delay of an output signal are reduced or minimized.

When the output node OUTPUT transitions from a high level to a low level (the second transition), the PMOS transistor MP22 is turned off and the PMOS transistor MP23 is turned on. At this time, since the NMOS transistor MN23 is turned off, no DC path exits between the control node N21 and the ground voltage VSS. Since the PMOS transistor MP23 is turned on, the control node N21 is maintained high via the PMOS transistor MP23 without floating.

In other words, when an input signal INPUT transitions from a low level to a high level (or more generally, has a first transition), an NMOS transistor MN21 is turned off, and a PMOS transistor MP21 is turned on only during a time needed until an output signal OUTPUT is increased from a ground voltage to a trip voltage of a CMOS inverter. Accordingly, negligible short-circuit current flows between a supply voltage VDDH and a ground voltage, resulting in a decrease in power consumption and/or the transition delay of an output signal is improved as compared with the conventional converter circuits described above.

When an input signal INPUT transitions from a high level to a low level (or more generally, has a second transition), an NMOS transistor MN21 is turned on with a PMOS transistor MP21 turned off. Thus, no short-circuit current flows between a supply voltage VDDH and a ground voltage, resulting in a decrease in power consumption and/or the transition delay of an output signal is improved as compared with the conventional converter circuits described above.

In the example embodiment of FIG. 5, the supply voltage of PMOS transistors MP22 and MP23 is identical to that of PMOS transistor MP21. However, it is obvious that a supply voltage of the PMOS transistors MP22 and MP23 may be greater than that of the PMOS transistor MP21.

Although FIG. 5 illustrates an example implementation of a voltage converter circuits, other equivalent converter circuits or converter circuits which achieve the same objective(s) could also be realized.

Although example embodiments of the present invention identify certain transitions as being low-to-high or high-to-low, each of these could be reversed.

As set forth above, example embodiments of the present invention reduce or eliminate the possibility of a floating voltage and/or a DC path.

Example embodiments of the present invention achieve this by maintaining a first driver of a driver pair in an active state, where current flows, for only a predetermined time period. Further, no current flows through the first driver to an output node when the first driver is in an inactive state.

The second driver may be activated by a second transition of the input signal to the output signal and the first driver may be maintained in the inactive state until the second transition is complete.

The first driver may be a pull-up driver and the second driver may be a pull-down driver. In example embodiments of the present invention, the pull-down driver may be maintained inactive when the input signal has a first transition and the pull-up driver may be maintained active only until an output signal reaches a logic threshold voltage and the pull-up driver may be maintained inactive when the input signal has a second transition.

In example embodiment, the input signal has a voltage of les than 1V, for example, 0.65-0.9V.

In other example embodiments of the present invention, an output node is pulled up to a second supply voltage in response to an output of a control node when an input signal has a first transition, but not a second transition and the output node is pulled down to ground voltage in response to the input signal when the input signal has a second transition, but not the first transition.

In other example embodiments of the present invention, the pull-up driver pulls an output node up to the second supply voltage, the pull-down driver pulls the output node down to ground voltage in response to the input signal, and a controller pulls the output node up to the second supply voltage in response to an output of a control node when the input signal has a first transition, but not a second transition and pulls the output node down to ground voltage in response to the input signal when the input signal has the second transition, but not the first transition.

In other example embodiments of the present invention, the pull-up driver pulls an output node up to the second supply voltage, the pull-down driver for pulls the output node down to ground voltage in response to the input signal, and the controller for controls the pull-up driver in response to the input signal and the output signal, so that the pull-up driver is inactive when the input signal has a second transition and active for a first portion of a first transition and inactive for a second portion of the first transition.

In other example embodiments of the present invention, an output node is pulled up to the second supply voltage in response to an output of a control node during a first portion of a first transition of the input signal, but not a second portion of the first transition or a second transition and the output node is pulled down to ground voltage in response to the input signal when the input signal has the second transition, but not the first transition.

In other example embodiments of the present invention, a pull-up driver and a pull-down driver pull an output node up and down, respectively and the controller controls the pull-up driver and the pull-down driver so that only one is active at any given time.

In other example embodiments of the present invention, a pull-up driver and a pull-down driver are controlled so that only one is active at any given time.

As set forth above, example embodiments of the present invention reduce or eliminate the possibility of a floating voltage and/or a DC path.

FIGS. 7-10 are diagrams for comparing the simulated performance of a voltage level converter circuit according to an example embodiment of the present invention and the conventional BTLC, DCVS, and SDCVS level converters. FIGS. 7-10 are level converter circuits that are designed using a 0.14 μm CMOS process technology. The simulation results were run at a temperature of 100° C. under the condition that an output load of 500 fF is connected to an output node. As described above, a voltage level converter circuit according to example embodiments of the present invention may be a dynamic level converter circuit, and may be referred to as a latched dynamic level converter (LDLC).

Figure 7:
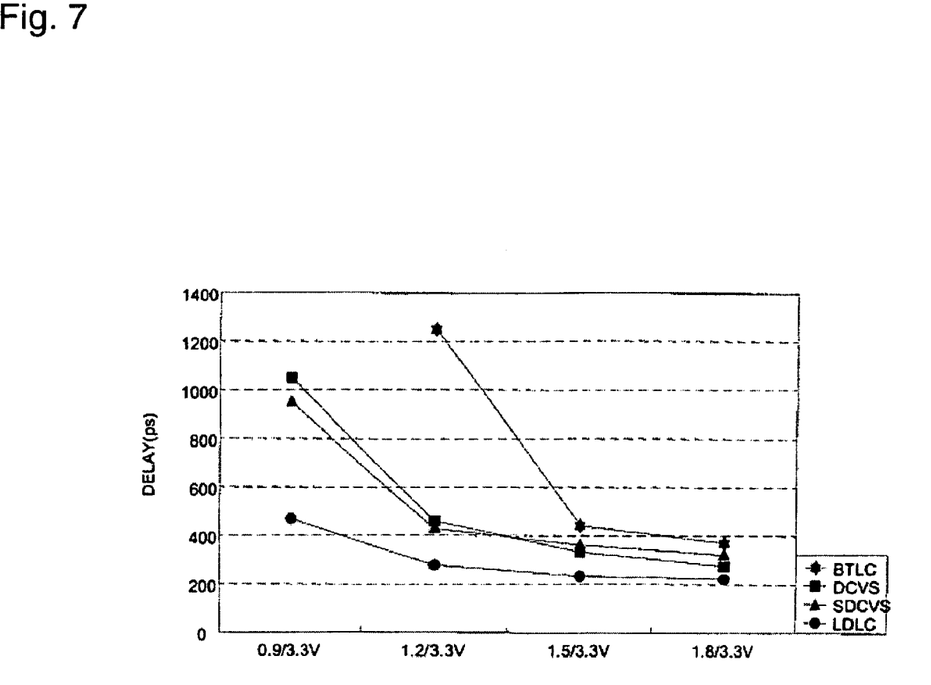
FIG. 7 is a diagram illustrating a comparison of low-to-high transition delays of an output signal for the example circuit implementation of FIG. 5 and the conventional level converters of FIGS. 1-3.
Figure 8:
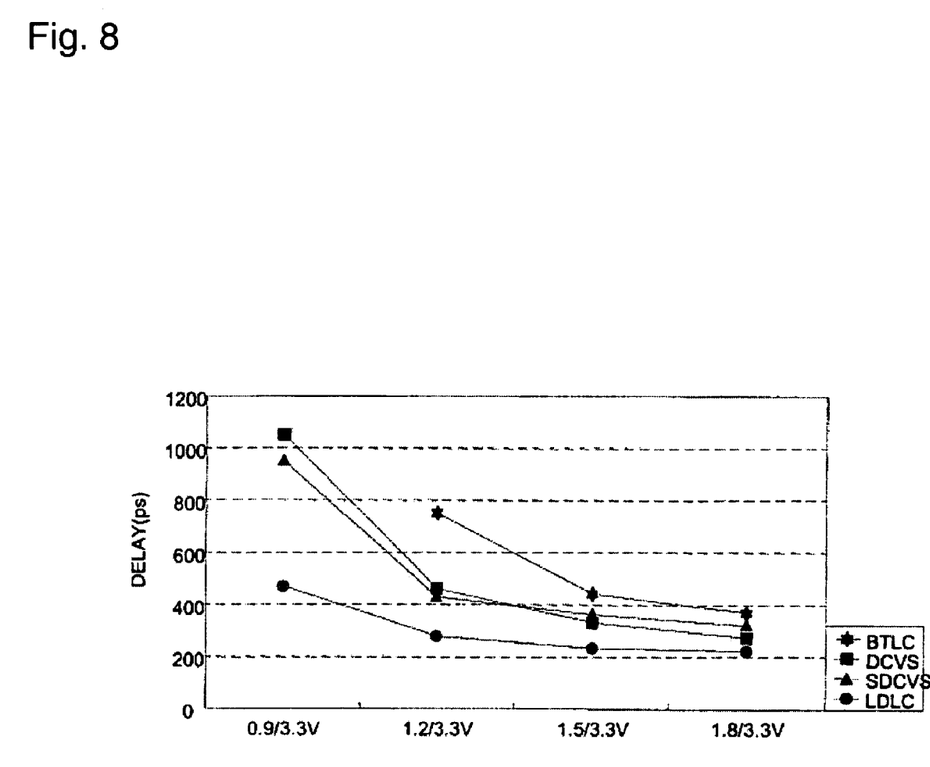
FIG. 8 is a diagram illustrating a comparison of high-to-low transition delays of an output signal for the example circuit implementation of FIG. 5 and the conventional level converters of FIGS. 1-3.
Figure 9:
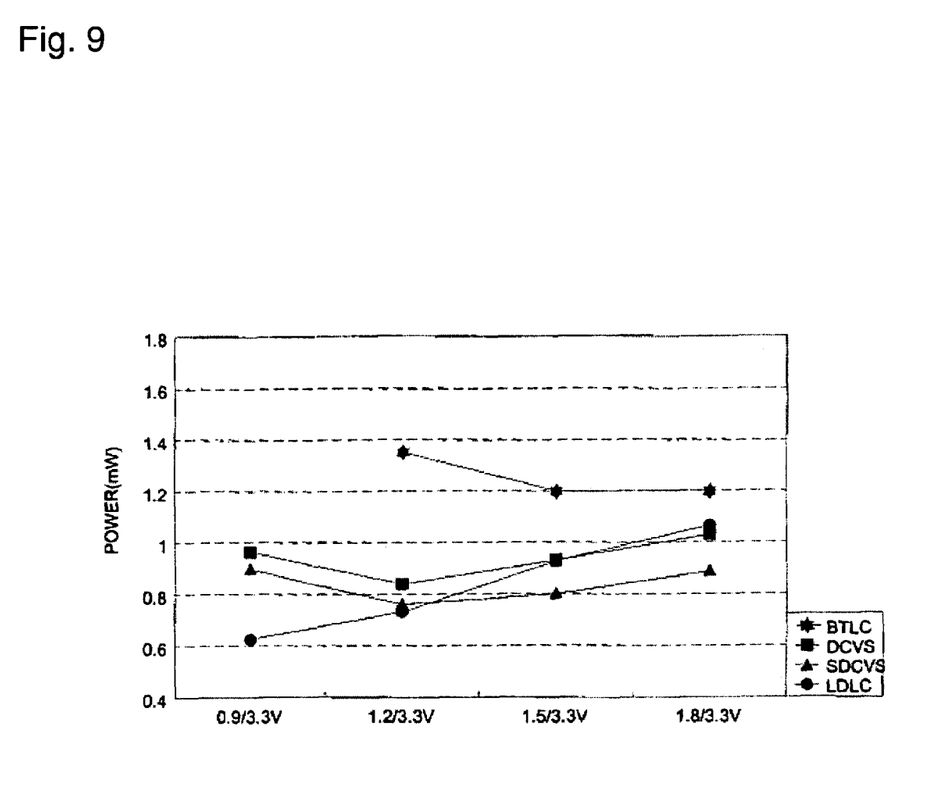
FIG. 9 is a diagram illustrating a comparison of power consumption for the example circuit implementation of FIG. 5 and the conventional level converters of FIGS. 1-3.

As illustrated in FIGS. 7 and 8, which show low-high transition delay and high-low transition delay of an output signal OUTPUT respectively, when a first supply voltage VDDL varying in a voltage range of 0.9V to 1.8V is supplied and a second supply voltage VDDH is fixed at 3.3V, the transition delay of an output signal of the LDLC according to example embodiments of the present invention may be shorter than those of the above described BTLC, DCVS and SDCVS converter circuits. In particular, as the first supply voltage VDDL is lowered, the transition delay of an output signal of the LDLC according to example embodiments of the present invention may become shorter than those of the above described BTLC, DCVS and SDCVS converter circuits. Accordingly, the LDLC according to example embodiments of the present invention may have an improved output driving capacity as compared with the BTLC, DCVS and SDCVS converter circuits. As the transition delay becomes relatively shorter, as illustrated in FIG. 9, power consumption of the LDLC according to example embodiments of the present invention may be decreased as compared with the BTLC, DCVS and SDCVS converter circuits.

Figure 10:
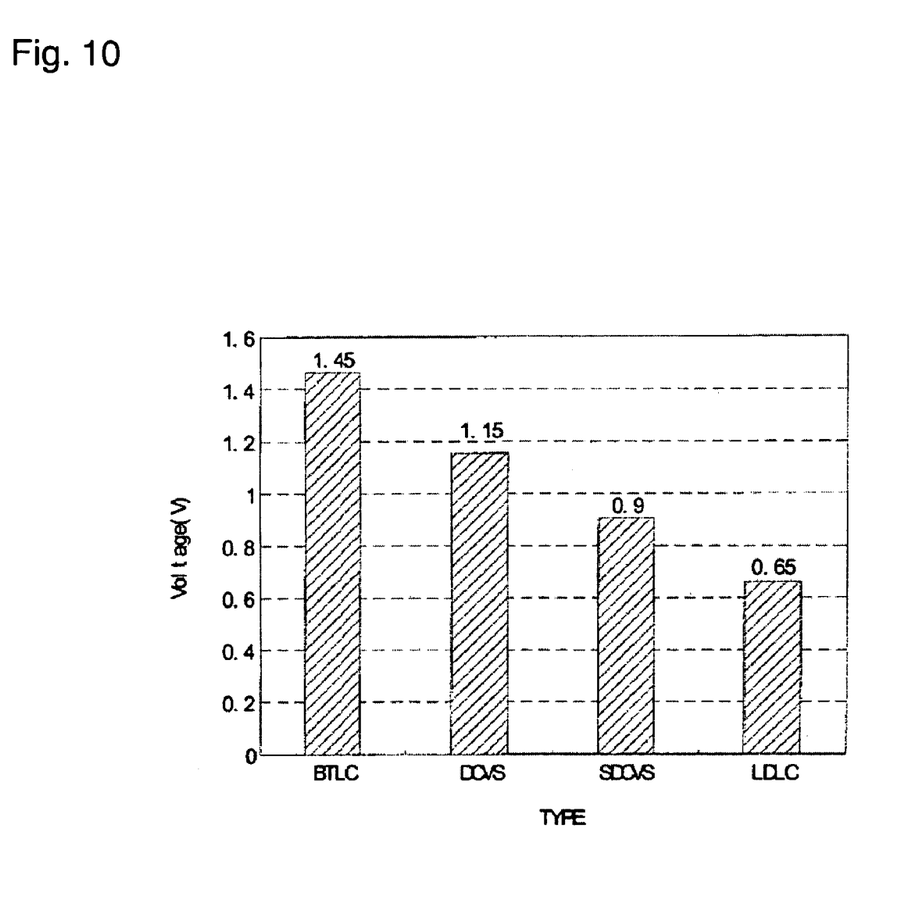
FIG. 10 is a diagram illustrating a comparison of operable minimum allowable voltage (also referred to as a low-voltage margin) for the example circuit implementation of FIG. 5 and the conventional level converters of FIGS. 1-3.

Referring to FIG. 10, which shows an operable minimum allowable voltage (also referred to as a low-voltage margin) when the first supply voltage VDDH is lowered, the LDLC according to example embodiments of the present invention may operate even at a supply voltage VDDL of 0.65V while the BTLC, DCVS and SDCVS converter circuits operate at supply voltages VDDL of 1.45V, 1.15V and 0.9V, respectively. That is, the LDLC according to example embodiments of the present invention may have an improved low-voltage margin as compared with those of the BTLC, DCVS and SDCVS converter circuits. A low-voltage margin of the LDLC according to example embodiments of the present invention may be improved in proportion to a reduced short-circuit current.

It will be apparent to those skilled in the art that other changes and modifications may be made in the above-described exemplary embodiments without departing from the scope of the invention herein, and it is intended that all matter contained in the above description shall be interpreted in an illustrative and not a limiting sense.

I claim:

1. A method for converting an input signal having a first voltage to an output signal having a second voltage, comprising:
   ensuring a pull-down driver is inactive when the input signal has a first transition and a pull-up driver is active only until the output signal reaches a logic threshold voltage;
   ensuring the pull-up driver is maintained inactive when the input signal has a second transition;
   discharging a control node of the pull-up driver to ground voltage;
   isolating the control node from the ground voltage; and
   precharging the control node to the second voltage.

2. The method of claim 1, further comprising:
supplying a current to prevent the control node from floating.

3. The method of claim 2, wherein the first transition is a transition from a logical "low" to a logical "high" and the second transition is a transition from a logical "high" to a logical "low" and the first voltage of the input signal is 0.65-0.9 V.

4. The method of claim 1, wherein no current flows through the pull-up driver to an output node when the pull-up driver is in an inactive state.

5. A voltage converter comprising:
a first driver and a second driver, both connected to an output node, the first driver receiving a second voltage and the second driver receiving a first voltage; and
a controller, connected to the first driver and second driver, receiving an input signal with the first voltage and receiving the second voltage and for performing a first transition of the input signal with the first voltage to an output signal with the second voltage;
the first driver being in an active state for only a predetermined time period;
a pre-charge circuit for charging a control node of the first driver to the second voltage in response to an output of a latch.

6. The voltage converter of claim 5, wherein no current flows through the first driver to the output node when the first driver is in an inactive state.

7. The voltage converter of claim 5, wherein the input signal has the first voltage and the output signal has the second voltage, where the second voltage is greater than the first voltage.

8. The voltage converter of claim 5, wherein the first driver is in the active state until the output signal reaches a logic threshold voltage.

9. The voltage converter of claim 8, wherein the logic threshold voltage is a logic threshold circuit of a detection circuit.

10. The voltage converter of claim 8, wherein the detection circuit includes at least one CMOS inverter.

11. The voltage converter of claim 8, wherein no current flows through the first driver to the output node when the first driver is in an inactive state.

12. The voltage converter of claim 5, wherein the second driver is activated by a second transition of the input signal, wherein the first driver is maintained in the inactive state until the second transition is complete.

13. The voltage converter of claim 12, wherein the first transition of the input signal is a transition from a logical "low" to a logical "high" and the second transition of the input signal is a transition from a logical "high" to a logical "low".

14. The voltage converter of claim 5, wherein a the first voltage of the input signal is 0.65-0.9 V.

15. The voltage converter of claim 5, wherein the input signal has the first voltage and the output signal has the second voltage, where the second voltage is greater than the first voltage, wherein the first driver is a pull-up driver which pulls the output signal up to the second voltage, the second driver is a pull-down driver which pulls the output signal down to a ground voltage, and the controller further includes,
a pre-charge circuit for charging a control node to the second voltage, and
a discharge and isolation circuit for isolating the control node from the ground voltage.

16. The voltage converter of claim 15, wherein the pull-up driver is in the active state until the output signal reaches a logic threshold voltage.

17. The voltage converter of claim 16, wherein the logic threshold voltage is a logic threshold circuit of a detection circuit.

18. The voltage converter of claim 16, wherein the detection circuit includes at least one CMOS inverter.

19. The voltage converter of claim 15, wherein no current flows through the pull-up driver to the output node when the pull-up driver is in an inactive state.

20. The voltage converter of claim 15, wherein the pull-down driver is activated by a second transition of the input signal into the output signal.

21. The voltage converter of claim 20, wherein the pull-up driver is maintained in the inactive state until the second transition is complete.

22. The voltage converter of claim 20, wherein the first transition is a transition from a logical "low" to a logical "high" and the second transition is a transition from a logical "high" to a logical "low".

23. The voltage converter of claim 15, wherein the first voltage of the input signal is 0.65-0.9 V.

24. The voltage converter of claim 15, wherein the controller further includes, a floating prevention circuit for supplying a current to prevent the control node from floating.

25. The voltage converter of claim 24, wherein a charging capability of the floating prevention circuit is less than a charging capability of the pre-charge circuit.

26. The voltage converter of claim 24, wherein the floating prevention circuit includes a transistor with a higher resistance than a transistor of the pre-charge circuit.

27. The voltage converter of claim 15, wherein the controller further includes, a detecting circuit for maintaining a voltage of the output signal.

28. The voltage converter of claim 27, wherein the detecting circuit is a latch circuit including at least two inverters.

29. A method for converting an input signal with a first voltage to an output signal with a second voltage, comprising:
receiving the second voltage and for pulling an output node up to the second voltage in response to an output of a control node of a pull-up driver when the input signal has a first transition, but not a second transition; and
receiving the first voltage and for pulling the output node down to ground voltage in response to the input signal when the input signal has the second transition, but not the first transition;
precharging the control node of the pull-up driver to the second voltage in response to an output of a latch.

30. A voltage converter for converting an input signal with a first voltage to an output signal with a second voltage, comprising:
a pull-up driver for receiving the second voltage and for pulling an output node up to the second voltage;
a pull-down driver for receiving the first voltage and for pulling the output node down to ground voltage in response to the input signal; and
a controller connected to the pull-up driver and the pull-down driver, receiving the input signal with the first voltage and receiving the second voltage, and for pulling the output node up to the second voltage in response to an output of a control node of the pull-up driver when the input signal has a first transition, but not a second transition and pulling the output node down to ground voltage in response to the input signal when the input signal has the second transition, but not the first transition;
a pre-charge circuit for charging a control node of the pull-up driver to the second voltage in response to an output of a latch.

31. A voltage converter for converting an input signal with a first voltage to an output signal with a second voltage, comprising:
- a pull-up driver for receiving the second voltage and for pulling an output node up to the second voltage;
- a pull-down driver for receiving the first voltage and for pulling the output node down to ground voltage in response to the input signal; and
- a controller connected to the pull-up driver and the pull-down driver, receiving the input signal with the first voltage and receiving the second voltage, and for controlling the pull-up driver in response to the input signal and the output signal, so that the pull-up driver is inactive when the input signal has a second transition and active for a first portion of a first transition and inactive for a second portion of the first transition;
- a pre-charge circuit for charging a control node of the pull-up driver to the second voltage in response to an output of a latch.

32. A method for converting an input signal with a first voltage to an output signal with a second voltage comprising:
- receiving the second voltage and for pulling an output node up to the second voltage in response to an output of a control node of a pull-up driver during a first portion of a first transition of the input signal, but not a second portion of the first transistion or a second transistion of the input signal; and
- receiving the first voltage and for pulling the output node down to ground voltage in response to the input signal when the input signal has the second transition, but not the first transition;
- precharging the control node of the pull-up driver to the second voltage in response to an output of a latch.

33. A voltage converter for converting an input signal with a first voltage to an output signal with a second voltage, comprising:
- a pull-up driver receiving the second voltage and a pull-down driver receiving the first voltage, for pulling an output node up and down, respectively; and
- a controller connected to the pull-up driver and the pull-down driver, receiving the input signal with the first voltage and receiving the second voltage, and for controlling the pull-up driver and the pull-down driver so that only one is active at any given time;
- a pre-charge circuit for charging a control node of the pull-up driver to the second voltage in response to an output of a latch.

34. The voltage converter of claim 33, wherein the pull-up driver is active only until the output node is charged to a logic threshold voltage. Image Page 19

35. A method for converting an input signal with a first voltage to an output signal with a second voltage, comprising:
- receiving the input signal with the first voltage and receiving the second voltage, and controlling a pull-up driver and a pull-down driver so that only one is active at any given time;
- precharging a control node of the pull-up driver to the second voltage in response to an output of a latch.

36. The method of claim 35, wherein the pull-up driver is active only until an output node is charged to a logic threshold voltage.

37. A method for converting an input signal having a first voltage to an output signal having a second voltage, comprising:
- discharging a control node of a pull-up driver to ground voltage;
- isolating the control node from the ground voltage; and
- precharging the control node to the second voltage in response to an output of a latch.

38. The method of claim 37, further comprising: supplying a current to prevent the control node from floating.

39. The method of claim 38, wherein a first transition of the input signal to output signal is a transition from a logical "low" to a logical "high" and a second transition of the input signal to the output signal is a transition from a logical "high" to a logical "low" and the first voltage of the input signal is 0.65-0.9 V.

40. The method of claim 37, wherein no current flows through the pull-up driver to an output node when the pull-up driver is in an inactive state.

* * * * *